United States Patent [19]

Chen

[11] Patent Number: 4,897,152

[45] Date of Patent: Jan. 30, 1990

[54] ETCHANT FOR REVEALING DISLOCATIONS IN II-VI COMPOUNDS

[75] Inventor: John-Sea Chen, Thousand Oaks, Calif.

[73] Assignee: Rockwell International Corporation, El Segundo, Calif.

[21] Appl. No.: 315,979

[22] Filed: Feb. 27, 1989

[51] Int. Cl.$^4$ .................. H01L 21/306; B44C 1/22; C03C 15/00; C03C 25/06

[52] U.S. Cl. .................. 156/637; 156/647; 156/655; 156/662; 252/79.2

[58] Field of Search .................. 252/79.1, 79.2, 79.4; 156/637, 639, 647, 655, 662

[56] References Cited

PUBLICATIONS

M. Brown et al., Determination of Slip Planes in $Cd_xHg_{(1-x)}Te$ by Etching of Dislocations Introduced by Microhardness Indentations, J. Phys. Colloque C6, 40, 151, (1979).

K. Nakagawa et al., Observation of Dislocations in Cadmium Telluride by Cathodoluminescence Microscopy, Appl. Phys. Letter, 34(9), May 1, 1979, pp. 574-575.

Y-C Lu et al., Etch Pit Studies in CdTe Crystals, J. Vac. Sci. Technol., A3(1), Jan./Feb. 1985, pp. 264-270.

E. P. Warekois et al., Crystallographic Polarity in the II-VI Compounds, J. Appl. Phys., vol. 34, No. 9, Feb. 1962, pp. 690-696.

S. G. Parker and J. E. Pinnel, Revelation of Dislocations in (Hg,Cd)Te by an Etch Technique, J. Electrochem. Soc., vol. 118, No. 11, pp. 1868-1869, Nov. 1971.

*Primary Examiner*—William A. Powell
*Attorney, Agent, or Firm*—H. Fredrick Hamann; Craig O. Malin

[57] ABSTRACT

The invention provides an etchant and a method of using the etchant for revealing dislocations on low index planes in group II-VI compounds such as $(Hg_xCd_{(1-x)})Te$. The etchant has a composition proportional to 80 ml water, 10 ml of hydrochloric acid, 20 ml of nitric acid, and 8 gm of potassium dichromate. In another embodiment, the concentration of nitric acid is reduced to 0%. The surface of the compound being examined is exposed to the etchant for about 20 second to 6 minutes depending upon the crystallographic plane being examined. The surface is then rinsed in water. For the {111}B plane, additional rinses in a 0.05% solution of bromine in methanol and methanol are used.

15 Claims, 3 Drawing Sheets

|—————|
10 MICRONS

|—————|
10 MICRONS

25 MICRONS

100 MICRONS

ETCHANT FOR REVEALING DISLOCATIONS IN II-VI COMPOUNDS

BACKGROUND OF THE INVENTION

This invention relates to the field of chemical etchants, and particularly to an etchant for revealing dislocations in group II-VI compounds.

Semiconducting compounds made from Group II-VI elements have important applications such as the use of $(Hg_xCd_{(1-x)})Te$ for infrared detectors. These detectors frequently consist of a layer of a compound grown on another layer or on a substrate of different composition, such as $(Hg_xCd_{(1-x)})Te$ layers epitaxially grown on CdTe substrates. The layers are grown on specific crystallographic planes. Defects in the crystal structures (dislocations) can propagate from the underlying layer or substrate into the active layer, and the number of dislocations in an epitaxial layer can be multiplied if the growth process is poorly controlled. Additionally, dislocations can be formed by strain caused from mismatch in the crystal structure between layers, or by impurities in the material, or by plastic deformation of the material. These dislocations can degrade the performance of the detector. Consequently it is important to use materials and processes which minimize the formation of dislocations. This requires that methods be developed for measuring the amount of dislocations in the material in order to develop low dislocation materials, optimize growth and other processes, and improve device performance. Additionally, quality control methods are needed to inspect substrates and epitaxial layers so that high dislocation material is rejected before incurring expensive processing.

X-ray and electron beam techniques (for example transmission electron microscopy) have been used to study dislocations in crystals, but these techniques are expensive and ineffective due to their spatial limitations in the study of the correlation between dislocation structure and detector performance.

A common technique for determining dislocation density in elemental and in semiconducting compounds has been the use of etchants. Etching techniques do not have spatial limitations such as transmission electron microscopy and are inexpensive and convenient. When semiconductors are exposed to suitable etchants, dislocations on the surface are selectively etched to form small pits. These etch pits can be counted to determine the number of dislocations in the particular crystallographic plane which is exposed to the etchant. Some of the dislocation etches which have been reported for group II-VI compounds are: water:hydrogen peroxide:hydrofluoric acid (K. Nakagawa et al, Observation of Dislocations in Cadmium Telluride by Cathodoluminescence Microscopy, Appl. Phys. Lett. 34(9), 1 May 1979, pp 574–575); nitric acid:potassium bichromate with varying silver ion concentration, and a silver nitrate etch (Y.-C Lu et al, Etch Pit Studies in CdTe Crystals, J. Vac. Sci. Technol. A3(1), Jan/Feb 1985, pp 264–270); etches using various combinations of nitric acid, hdrochloric acid, water, bromine, methanol, acetic acid and ferric chloride (M. Brown et al, Determination of Slip planes in $Cd_xHg_{(1-x)}Te$ by Etching of Dislocations Introduced by Microhardness Indentations, J. Phys. Colloque C6,40,151 (1979); and nitric acid:hydrofluoric acid etchant, potassium bichromate:sulfuric acid etchant, nitric acid:hydrofluoric acid etchant, nitric acid:hydrochloric acid:water etchant, and nitric acid:acetic acid:hydrochloric acid:sulfuric acid etchant (E. P. Warekois et al, Crystallographic Polarity in the II-VI Compounds, J. of Appl. Phys., vol. 34 no. 9, Feb 1962, pp 690–696.

The effectiveness of an etchant depends upon the crystallographic plane being etched. In some planes there is not a sufficient difference in etching rate between the dislocation and the surrounding matrix to reveal clearly each dislocation. For prior art etchants, this is particularly true for the {110} planes in $(Hg_xCd_{(1-x)})Te$ which is an important plane because this easily cleaved plane is perpendicular to the {111} B plane on which most devices are fabricated. This invention overcomes this limitation in prior art etchants by providing an etchant and etchant conditions which can reveal dislocations on the {110} as well as all the low index planes in $(Hg_xCd_{(1-x)})Te$ and other group II-IV compounds.

SUMMARY OF THE INVENTION

It is an object of the invention to provide an etchant for revealing dislocations in group II-VI compounds.

It is an object of the invention to provide an etchant for revealing dislocation on planes {110}, {111}B, {111}A, {100}, {311} and others of $(Hg_xCd_{(1-x)})Te$ compounds.

According to the invention, an etchant is provided for revealing dislocations on low index planes in group II-VI compounds such as $(Hg_xCd_{(1-x)})Te$. In one embodiment, the etchant has a composition proportional to 80 ml water, 10 ml of hydrochloric acid, 20 ml of nitric acid, and 8 gm of potassium dichromate. In another embodiment, the concentration of nitric acid in the etchant is reduced to 0%.

To reveal the dislocations on a particular crystallographic plane, the etchant is applied to the surface formed by that plane. It is allowed to etch the surface for about 20 seconds to about 6 minutes, depending upon the crystallographic plane being examined. The surface is then rinsed in water. If the {111}B plane is being examined, the surface is also rinsed in a 0.05% solution of bromine in methanol, followed by a final rinse in methanol. Dislocations appear as small pits in the surface as a result of the differential rate of etching between the dislocation and the crystallographic plane.

These and other objects and features of the invention will be apparent from the following detailed description taken with reference to the accompanying drawings.

DESCRIPTION OF THE INVENTION

Dislocations are imperfections in the structure of a crystal. They can be revealed by etching a surface of the crystal (a crystallographic plane) with an etchant which dissolves the dislocation material at a different rate from the rate at which the etchant dissolves the material on the surface being examined. The dislocations are then revealed as small pits on the surface. Because different crystallographic planes etch at different rates, the conditions used to reveal dislocations varies depending upon the plane being etched. An important feature of this invention is the fact that the etchant can be used to reveal dislocations on many different planes, a capability that is difficult or unobtainable with prior art etchants.

The etchant is a solution of potassium dichromate, hydrochloric acid, nitric acid and water. Although the proportions of these ingredients can be varied over a fairly wide range, in a preferred embodiment the composition is in the ratio of 10 ml hydrochloric acid, to 20 ml of nitric acid, to 80 ml of water, to 8 gm of potassium dichromate.

In a second preferred embodiment, the concentration of nitric acid in the above etchant is reduced to 0%.

In general, the method of the invention comprises exposing a selected crystallographic plane of group II-VI compound to the etchant for a period of time which is empirically determined to give optimum results for the particular plane being etched and for the particular composition (or concentration) of the etchant being used. After etching, the material is then rinsed. The surface can then be examined microscopically and the dislocation density determined by counting the number of etch pits per unit area.

Several examples of the invention are given below.

EXAMPLE I (110) Plane

| Etchant Used: | D.I. water | 80 ml |
|---|---|---|
| | Hydrochloric acid (37%) | 10 ml |
| | Nitric acid (70%) | 20 ml |
| | Potassium dichromate | 8 gm |

Figure 1:
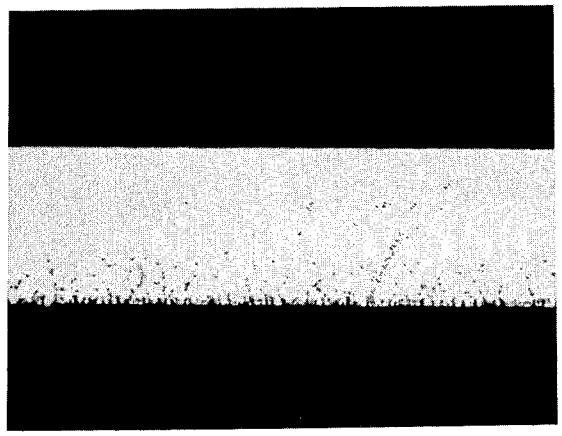
FIG. 1 is a photomicrograph of a (110) cleavage plane of an epitaxial layer of $(Hg_xCd_{(1-x)})Te$ on a CdTe substrate after etching.

An epitaxial layer of $(Hg_xCd_{(1-x)})Te$ was grown on a substrate of CdTe. CdTe. The sample was cleaved along its (110) cleavage plane to provide a surface for etching. The sample was then placed in a 100 cc beaker with the etchant and moderately agitated (60 runs per minute) for 1 minute. The sample was removed from the etchant and rinsed in D.I. water for 30 seconds. The etched sample was examined microscopically to reveal the dislocations as shown in FIG. 1. The light colored layer is the epitaxial layer of $(Hg_xCd_{(1-x)})Te$. The lower dark material is the CdTe substrate. The small black pits in the epitaxial layer are the dislocations. As shown in FIG. 1, the concentration of dislocations is greatest near the interface between the substrate and the epitaxial layer.

EXAMPLE II (100) Plane

Figure 2:
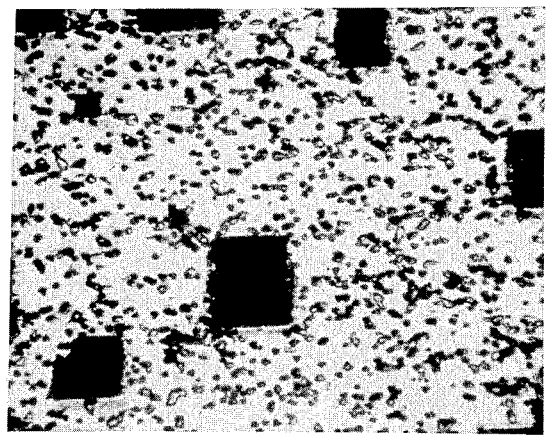
FIG. 2 is a photomicrograph of a (100) plane of molecular beam epitaxy (MBE) $(Hg_xCd_{(1-x)})Te$ after etching.

A (100) crystallographic plane of a $(Hg_xCd_{(1-x)})Te$ sample was etched and rinsed as described in Example I except that the etching time was only 20 seconds to avoid overetching. FIG. 2 shows the resulting features on the (100) plane. The small, numerous pits are the dislocations. The large dark squares are hillocks.

EXAMPLE III (111)A Plane

Figure 3:
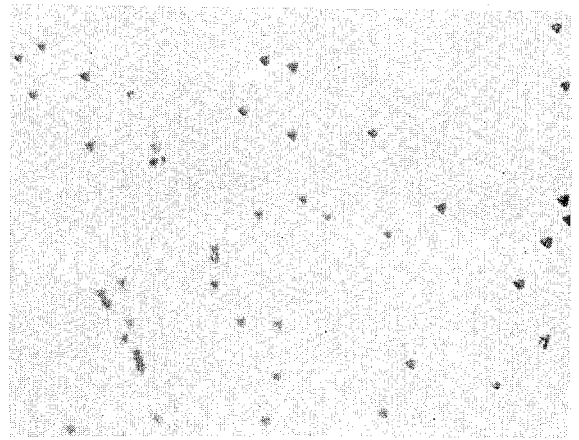
FIG. 3 is a photomicrograph of a (111)A plane of liquid phase epitaxy (LPE) $(Hg_xCd_{(1-x)})Te$ after etching.

A (111)A plane (the "A" plane is a HgCd plane) in a $(Hg_xCd_{(1-x)})Te$ sample was etched and rinsed as described in Example II. FIG. 3 shows the resulting features on the (111)A plane. The dark triangular pits are the dislocations.

EXAMPLE IV (111)B Plane

Figure 4:
FIG. 4 is a photomicrograph of a (111)B plane of LPE $(Hg_xCd_{(1-x)})Te$ after etching.

A (111)B plane (the "B" plane is a Te plane) in a $(Hg_xCd_{(1-x)})Te$ sample was etched and rinsed as described in Example I except that the etching time was 6 minutes and the water rinse was followed by a second rinse for 2 seconds in a 0.05% Br in methanol solution and a third rinse for 5 seconds in methanol. FIG. 4 shows the resulting features on the (111)B plane. The small dark pits are the dislocations. By counting these pits, it was determined that the dislocation density on this plane was $1.5 \times 10^5$ per $cm^2$.

EXAMPLE V (110) Plane

| Etchant Used: | D.I. water | 80 ml |
|---|---|---|
| | Hydrochloric acid (37%) | 10 ml |
| | Nitric acid (70%) | 0 ml |
| | Potassium dichromate | 8 gm |

A sample was prepared, etched, rinsed, and blow dried in nitrogen as described in Example I except that the above etchant was used. This treatment produced etch pits such as shown in FIG. 1 except the pits were somewhat larger using the etchant without the nitric acid.

EXAMPLE VI (311) Plane

Figure 5:
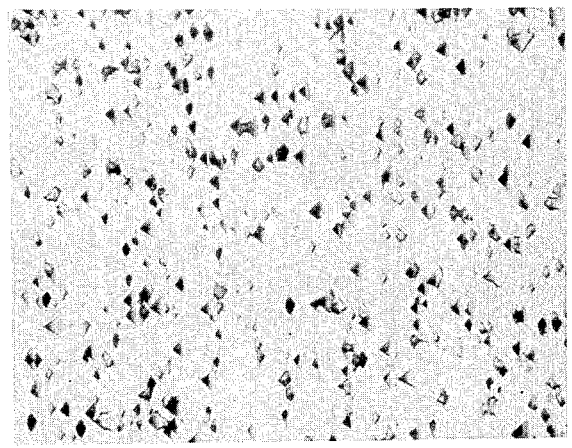
FIG. 5 is a photomicrograph of a (311) plane of metalorganic chemical vapor deposition (MOCVD) $(Hg_xCd_{(1-x)})Te$ after etching.

A layer of $(Hg_xCd_{(1-x)})Te$ in the (311) plane was grown using MOCVD. It was etched and rinsed as described in Example II. FIG. 5 shows the resulting features on the (311) crystallographic plane. The triangular pits are the dislocations.

The above Examples are summarized in the following table:

| Crystallographic Plane | Etchant | Etching Time | Rinse |
|---|---|---|---|
| (110) | Ex. I | 60 s | 30 s in D.I. water |
| (100) | Ex. I | 20 s | 30 s in D.I. water |
| (111)A | Ex. I | 20 s | 30 s in D.I. water |
| (111)B | Ex. I | 360 s | 30 s in D.I. water, 2 s in 0.05% Br /methanol, 5 s in methanol |
| (110) | Ex. V | 60 s | Rinse in D.I. water |
| (311) | Ex. I | 20 s | 30 s in D.I. water |

For other crystallographic planes with higher indices, an etching time of 60 seconds is long enough for dislocation revealing. In general, it is easier to reveal dislocations on the Cd-rich planes than the Te-rich planes. Using the etching conditions listed above, the sizes of etch pits are about 1 micron. If different sizes are desired, it can be accomplished simply by varying etching time or, for smaller sizes, by diluting the etchant with D.I. water. A slight etch in dilute Br-methanol solution may be helpful to remove any etching products covering the sample surface.

This etchant dissolves CdTe faster than HgTe. Therefore, for CdTe-rich compound the etching time should be shorter or the etchant should be diluted with water. For example, a 2 second etch is sufficient to reveal dislocations on {111}A and {110} planes of CdTe wafer.

Although the above examples illustrate the use of the invention to reveal dislocations in $(Hg_xCd_{(1-x)})Te$, it is clear that the invention can be utilized in similar group II–VI compounds. Tests have been run on other II–VI compounds to confirm this for: CdTe, $(Hg_xZn_{(1-x)})Te$, HgTe, $(Hg_xMn_{(1-x)})Te$, and $Cd(Se_xTe_{(1-x)})$. Other group II–VI compounds to which the invention should be applicable include (but are not limited to): HgSe, CdSe, ZnTe, $(Cd_xZn_{(1-x)})Te$, $(Hg_xCd_yZn_z)Te$, $(Hg_xMn_yCd_z)Te$, and other combinations of group II–VI compounds. In these formulas, x is a value equal to or less than 1, and $x+y+z$ equals 1.

The preferred embodiments of this invention have been illustrated by the examples described above. Modifications and additional embodiments, however, will undoubtedly be apparent to those skilled in the art. For example, concentrations different from the exemplary solutions may be used and compensated for by changing the etching time. The proportion of ingredients, and the etching times can be changed to provide optimized conditions based upon empirical test within the skill of the artisan. Furthermore, equivalent ingredients such as different alcohols may be substituted for those illustrated and described herein. Consequently, the exemplary embodiments should be considered illustrative, rather than inclusive, while the appended claims are more indicative of the full scope of the invention.

What is claimed is:

1. An etchant for revealing dislocations in group II–VI compounds comprising:
   water;
   hydrochloric acid;
   nitric acid; and
   potassium dichromate.

2. The etchant as claimed in claim 1 wherein for every 10 ml of hydrochloric acid there is approximately 20 ml of nitric acid, 80 ml of water, and 8 gm of potassium dichromate.

3. The etchant as claimed in claim 1 without the nitric acid.

4. The etchant as claimed in claim 3 wherein for every 10 ml of hydrochloric acid there is approximately 80 ml of water, and 8 gm of potassium dichromate.

5. A method for revealing dislocations in group II–VI compounds comprising the steps of:
   preparing an etchant of water, hydrochloric acid, and potassium dichromate;
   exposing a surface of the compound to the etchant; and
   removing the etchant from the surface of the compound.

6. The method as claimed in claim 5 wherein for every 10 cc of hydrochloric acid there is approximately 80 cc of water and 8 gm of potassium dichromate.

7. The method as claimed in claim 6 wherein the etchant includes nitric acid.

8. The method as claimed in claim 7 wherein for every 10 ml of hydrochloric acid there is approximately 20 ml of nitric acid, 80 ml of water, and 8 gm of potassium dichromate.

9. The method as claimed in claim 6 wherein the compound is a $(Hg_xCd_{(1-x)})Te$ compound, the surface being exposed to the etchant is a {110} plane, the step of exposing a surface comprises placing the surface in a beaker of etchant for approximately 1 minute while agitating the etchant, and the step of removing the etchant comprises rinsing the surface in water and blow drying it.

10. The method as claimed in claim 5 wherein the group II–VI compound is selected from the group consisting of $(Hg_xCd_{(1-x)})Te$, CdTe, $(Hg_xZn_{(1-x)})Te$, $(Hg_xMn_{(1-x)})Te$, HgTe, and $Cd(Se_xTe_{(1-x)})$, where x equals 1 or less.

11. The method as claimed in claim 5 wherein the group II–VI compound is selected from the group consisting of, ZnTe, CdSe, HgSe, $(Cd_xZn_{(1-x)})Te$, $(Hg_xCd_yZn_z)Te$, and $(Hg_xMn_yCd_z)Te$, where x equals 1 or less and $x+y+z$ equals 1.

12. A method of revealing dislocations in $(Hg_xCd_{(1-x)})Te$ comprising the steps of:
   preparing an etchant having a composition proportional to approximately 10 ml of hydrochloric acid, 20 ml of nitric acid, 80 ml of water, and 8 gm of potassium dichromate;
   exposing a 111A crystallographic plane to the etchant for approximately 20 seconds; and
   rinsing the exposed plane in water.

13. A method of revealing dislocation in $(Hg_xCd_{(1-x)})Te$ comprising the steps of:
   preparing an etchant having a composition proportional to approximately 10 ml of hydrochloric acid, 20 ml of nitric acid, 80 ml of water, and 8 gm of potassium dichromate;
   exposing a 111B crystallographic plane to the etchant for approximately 6 minutes;
   first rinsing the exposed plane in water for approximately 30 seconds;
   second rinsing the exposed plane in a 0.05% solution of bromine in methanol for approximately 2 seconds; and
   third rinsing the exposed plane in methanol for approximately 5 seconds.

14. A method of revealing dislocation in $(Hg_xCd_{(1-x)})Te$ comprising the steps of:
   preparing an etchant having a composition proportional to approximately 10 ml of hydrochloric acid, 20 ml of nitric acid, 80 ml of water, and 8 gm of potassium dichromate;
   exposing a 110 crystallographic plane to the enchant for approximately 1 minute; and
   rinsing the exposed plane in water.

15. A method of revealing dislocation in $(Hg_xCd_{(1-x)})Te$ comprising the steps of:
   preparing an etchant having a composition proportional to approximately 10 ml of hydrochloric acid, 20 ml of nitric acid, 80 of water, and 8 gm of potassium dichromate;
   exposing a 100 crystallographic plane to the etchant for approximately 20 seconds; and
   rinsing the exposed plane in water.

* * * * *